United States Patent [19]

Tamura

[11] Patent Number: 5,420,620

[45] Date of Patent: May 30, 1995

[54] RECORDING APPARATUS HAVING A RECORDING HEAD USING AN ELECTRICALLY CONDUCTIVE SHEET

[75] Inventor: Hideo Tamura, Kawasaki, Japan

[73] Assignee: Canon Kabushiki Kaisha, Tokyo, Japan

[21] Appl. No.: 22,436

[22] Filed: Feb. 16, 1993

Related U.S. Application Data

[63] Continuation of Ser. No. 653,898, Feb. 12, 1991, abandoned.

[30] Foreign Application Priority Data

Feb. 13, 1990 [JP] Japan ................... 2-29492
Feb. 8, 1991 [JP] Japan ................... 3-017636

[51] Int. Cl.⁶ ..................... B41J 2/05; H01R 9/09
[52] U.S. Cl. ........................... 347/50; 347/58; 174/88 R; 439/91
[58] Field of Search ............ 346/140; 439/91, 86, 439/66, 591; 174/88 R; 347/50, 58

[56] References Cited

U.S. PATENT DOCUMENTS

| | | | |
|---|---|---|---|
| 3,541,222 | 11/1970 | Parks | 174/88 X |
| 4,209,481 | 6/1980 | Kashiro | 439/91 X |
| 4,313,124 | 1/1982 | Hara . | |
| 4,345,262 | 8/1982 | Shirato et al. . | |
| 4,459,600 | 7/1984 | Sato et al. | 346/140 R |
| 4,463,359 | 7/1984 | Ayata et al. . | |
| 4,558,333 | 12/1985 | Sugitani et al. . | |
| 4,723,129 | 2/1988 | Endo et al. . | |
| 4,740,796 | 4/1988 | Endo et al. . | |
| 4,887,098 | 12/1989 | Hawkins et al. | 346/140 R |
| 5,049,084 | 9/1991 | Bakke | 439/66 |
| 5,197,892 | 3/1993 | Yoshizawa | 439/91 |

FOREIGN PATENT DOCUMENTS

| | | | |
|---|---|---|---|
| 284820 | 10/1988 | European Pat. Off. . | |
| 0353114 | 1/1990 | European Pat. Off. . | |
| 61-016862 | 1/1986 | Japan . | |
| 226036 | 9/1988 | Japan | 439/91 |
| 63-299065 | 12/1988 | Japan . | |
| 1302830 | 6/1989 | Japan . | |

*Primary Examiner*—Joseph W. Hartary
*Attorney, Agent, or Firm*—Fitzpatrick, Cella, Harper & Scinto

[57] ABSTRACT

An electrically conducting sheet comprises a plurality of electrically conductive members arranged in a insulator, for electrically connecting a plurality of wiring pads on a first substrate and a corresponding plurality of wiring pads on a second substrate one by one to each other by its intervention between the first and second substrates. The distribution density of the electrically conductive members is set to be different in place. Alternatively, the size of the electrically conductive members may be set to be different in position. The electrically conducting sheet can be used in a recording head incorporated into a recording apparatus.

16 Claims, 7 Drawing Sheets

RECORDING APPARATUS HAVING A RECORDING HEAD USING AN ELECTRICALLY CONDUCTIVE SHEET

This application is a continuation of application Ser. No. 07/653,898 filed Feb. 12, 1991, now abandoned.

BACKGROUND OF THE INVENTION

1. Field of the Invention

This invention relates to an electrically conductive or conducting sheet, a recording head using the electrically conducting sheet and an ink jet recording apparatus using the recording head.

2. Related Background Art

An ink jet recording head as used in an ink jet recording apparatus has an element substrate, which is a first substrate on which recording elements (energy generating bodies) for permitting ink discharge are mounted, and a driving substrate, which is a second substrate for coupling a driving signal for driving the recording elements on the element substrate, to the first substrate These substrates are being electrically connected to each other.

In the past, to connect electrically the element substrate and the driving substrate, a wire bonding method has been used. However, this method has disadvantages in that it takes a considerable time and it is difficult to replace one of the substrates if it fails. So, recently, connection has been made by means of an electrically conducting sheet 61 as shown in FIG. 6.

The electrically conducting sheet 61 is provided with a plurality of the same columnar electrically conductive members 63 buried therein substantially vertically. The members 63 are arranged in three rows at a predetermined pitch interval L11 as is shown in FIG. 6. These members 63 are exposed at one end thereof on one surface of the electrically conducting sheet 61 and at the other end thereof on the other surface of the electrically conducting sheet 61.

FIG. 7 shows an ink jet recording head in which the electrically conducting sheet 61 is sandwiched between the element substrate 72 and the driving substrate 73 and provides electric connection therebetween, and FIG. 8 is a partially expanded view showing in detail the connection portion.

The element substrate 72 mounting at one end thereof an ink accommodating chamber member 74 is connected at its other end to one end of the driving substrate through the electrically conducting sheet. A plurality of wiring pads are provided on the respective substrates 72 and 73, respectively, which correspond to each other and are opposed to each other. The corresponding wiring pads on the respective substrates are electrically connected to each other by pressing them to the corresponding columnar electrically conductive member 63 or by providing alloy junctions between the wiring pads 86 and 87 and the corresponding columnar electrically conductive member 63.

The pitch interval defining the distribution density of the arrangement of the wiring pads provided on the element substrate 72 and the driving substrate 73, respectively, is typically made different according to the amount of current flowing through each pad in the light of electrical insulation. The wiring pads 86 and 87 on the element substrate 72 and the driving substrate 73, respectively are arranged at two different intervals $l_{11}$ and $l_{12}$ ($l_{11} < l_{12}$). So, the pitch interval L11 defining the distribution density of the electrically conductive members 63 buried in the insulator 62 is made smaller than the pitch interval $l_{12}$ and is made equal to the smaller interval $l_{11}$. Therefore, in the areas within which the respective wiring pads 86 and 87 are arranged at the wider pitch interval $l_{12}$, there are many electrically conductive members 63 which do not touch to the respective wiring pads 86 and 87, which become useless electrically conductive members. Also, since the electrically conducting sheet 61 has over its entire face the electrically conductive members 63 distributed in a high density, in producing such conducting sheets 61, and specially, in case where minute connection is made in ink jet heads for performing highly refined recording, a yield in production is not good, and their production cost increases. This results in ink jet recording heads with a high production cost. Further, since the numbers of the electrically conductive members 63 connected to the respective wiring pads are the same in spite of the amount of current therethrough and the respective electrically conductive members 63 are the same in shape, the current flows through the respective conductive members at different amounts, and the amount of heat generated thereby is different between the electrically conductive members 63. Therefore, there occurs inequality (dispersion) in the amount of heat generated in parts, and this would possibly decrease the printing quality, especially in a recording head using heating.

Furthermore, an electrically conductive member through which the largest current flows deteriorates more quickly. So, since the usable period of time for the recording head utilizing the above-mentioned sheet is determined by the life of the electrically conductive member carrying the largest current, it would be difficult to provide a long life recording head.

Accordingly, there is a subject to be settled in the above-mentioned prior art wire bonding method of producing ink jet recording heads and which has been used to connect the respective substrates, because it requires considerable time and makes it difficult to replace the respective substrates if they fail. There is a further subject to be settled since in the prior art arrangement in which the respective substrates are connected through an electrically conducting sheet, so that there remain in that sheet many unused electrically conductive members which are not contacted to the wiring pads of the respective substrates, a wasteful situation would be produced and the production cost of the resulting ink jet recording heads would increase. There is a still further subject to be settled since current flows through the respective electrically conductive members in the electrically conducting sheet at different levels, that shortens the life of the electrically conducting sheet, and thus of the resulting ink jet recording head using such electrically conducting sheet.

SUMMARY OF THE INVENTION

This invention is intended to cope with the above-mentioned subjects to be settled in the prior art, and it is an object of the invention to provide an electrically conducting sheet for use in a recording head, which can be produced at a shortened time and a low price, and has a long life, as well as the recording head using the electrically conducting sheet and a recording apparatus using this recording head.

The above-mentioned object and the other objects of this invention are obtained in accordance with this invention by:

a recording head wherein plural wiring pads provided on a first substrate and corresponding plural wiring pads provided on a second substrate are electrically connected one by one to each other through an electrically conducting sheet comprising plural electrically conductive members arranged in an insulator, characterized in that the distribution density of said electrically conductive members is made different in place;

a recording head wherein plural wiring pads provided on a first substrate and corresponding plural wiring pads provided on a second substrate are electrically connected one by one to each other through an electrically conducting sheet comprising plural electrically conductive members arranged in an insulator, characterized in that the size of said electrically conductive members is made different in position;

a recording apparatus having a recording head wherein plural wiring pads provided on a first substrate and corresponding plural wiring pads provided on a second substrate are electrically connected one by one to each other through an electrically conducting sheet comprising plural electrically conductive members arranged in an insulator, an ink supply system for supplying ink to said recording head, a recording medium on which recording is effected by the ink discharged from said recording head, and conveyance means for conveying said recording medium, characterized in that the distribution density of said plural electrically conductive members is made different in place;

a recording apparatus having a recording head wherein plural wiring pads provided on a first substrate and corresponding plural wiring pads provided on a second substrate are electrically connected one by one to each other through an electrically conducting sheet comprising plural electrically conductive members arranged in an insulator, an ink supply system for supplying ink to said recording head, a recording medium on which recording is effected by the ink discharged from said recording head, and conveyance means for conveying said recording medium, characterized in that the size of said plural electrically conductive members is made different in position; or an electrically conducting sheet for a recording head wherein it comprises plural electrically conductive members arranged in an insulator, and electrically connects plural wiring pad provided on a first substrate and corresponding plural wiring pads provided on a second substrate one by one to each other by its intervention between said first and second substrates, characterized in that the distribution density of said plural electrically conductive members is made different in place.

In accordance with this invention, instead of making the pitch interval uniform in arranging the electrically conductive members in the insulator, the distribution density thereof is caused to vary in position. Alternatively, instead of making the size of the electrically conductive members uniform, it is caused to vary in place. Accordingly, the various disadvantages encountered in the prior art are resolved. For example, if the distribution density of the electrically conductive members is set correspondingly to the distribution density of the plural wiring pads provided on the respective first and second substrates, it is possible to decrease the number of the useless electrically conductive metal members which do not contact with the respective up and down wiring pads. Also, if the distribution density is set correspondingly to the amount of current flowing between the related wiring pads of the respective up and down substrates through the metal intervened members, it is possible to make equal the current flowing through the respective the metal members in amount, so that since the heating of and current concentration to specified electrically conductive members are prevented, the lives of the respective electrically conductive members are balanced, and thus, the life of the recording head can be elongated and the deterioration of recording quality can be obstructed. It is also possible to obtain the similar effect when the electrically conductive members are caused to vary in size correspondingly to the distribution density of the wiring pads and/or the amount of the current therethrough.

BRIEF DESCRIPTION ON THE DRAWINGS

DESCRIPTION OF THE PREFERRED EMBODIMENT

Embodiments in accordance with the present invention will be described now with reference to the drawings.

Figure 1:
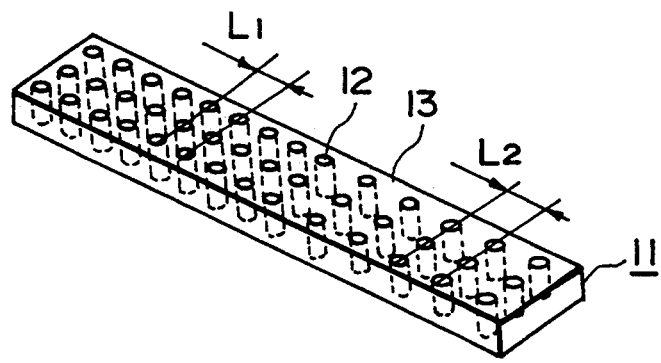
FIG. 1 is a perspective view showing the external appearance of one embodiment of an electrically conducting sheet as used in a recording head according to this invention.
Figure 2:
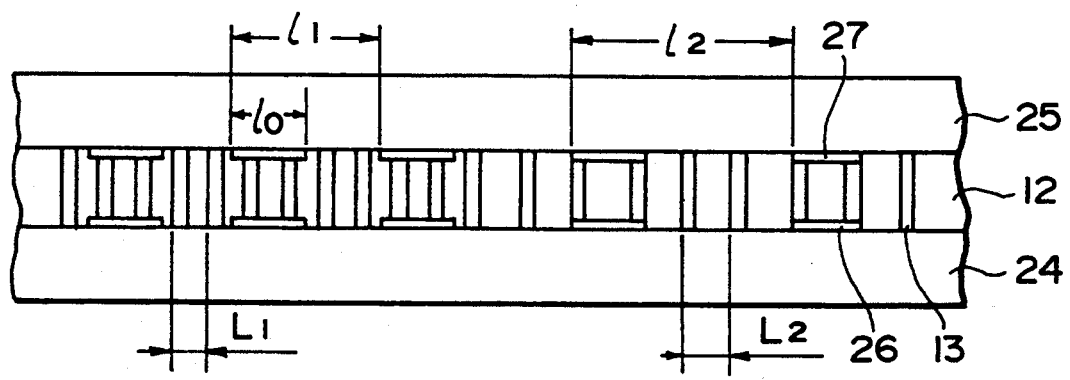
FIG. 2 is a partial section view showing an ink jet recording head, specially the situation of connecting a element substrate and a driving substrate by the electrically conducting sheet intervened therebetween.

FIG. 1 is a perspective view showing the external appearance of one embodiment of an electrically conducting sheet as used in a recording head according to this invention, and FIG. 2 is a partial section view showing an ink jet recording head, specially the situation of connecting an element substrate 24 and a driving substrate 25 by the electrically conducting sheet 11 intervened therebetween.

Figure 6:
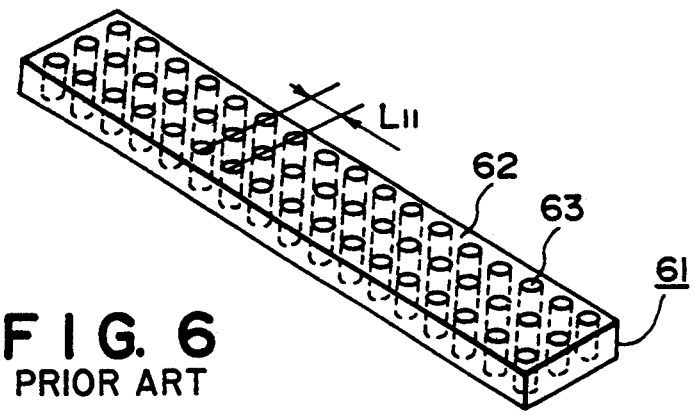
FIG. 6 is a perspective view showing the external appearance of a prior art electrically conducting sheet.
Figure 7:
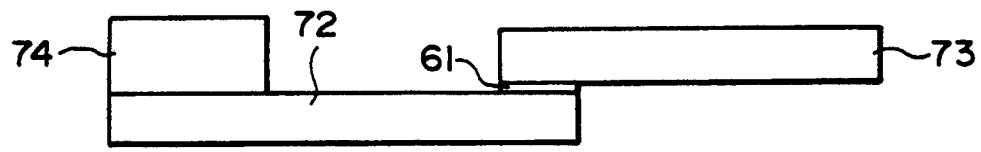
FIG. 7 is an ink jet recording head using the electrically conducting sheet illustrated in FIG. 6.
Figure 8:
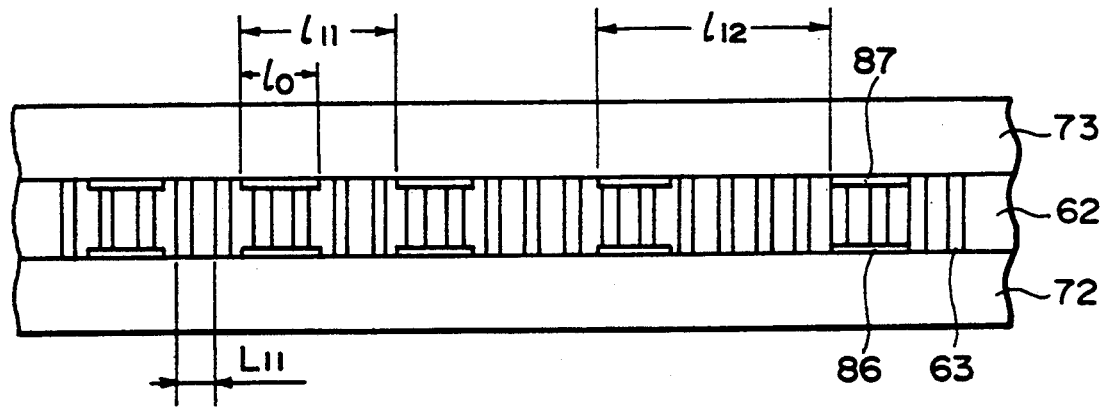
FIG. 8 is a partial enlarged view showing in detail the situation of a connecting portion in the ink jet recording head illustrated in FIG. 7.

The electrically conducting sheet 11 is a similar one to the prior art electrically conducting sheet 61 shown in FIG. 6 in that it has columnar electrically conductive members 13 buried therein and arranged in three rows. But in this invention, the pitch intervals at which the electrically conductive members 13 are disposed are made different, as shown, corresponding to wiring pads (refer to FIG. 2) provided on the respective element substrate 24 and the driving substrate 25, which are electrically connected by the electrically conductive members 13. The electrically conductive members 13 are arranged at pitch interval L1 at the left side in the drawing, and at pitch interval L2 which is wider than L1 at the right side.

As shown in FIG. 2, the wiring pads 26 and 27 provided on the respective element substrate 24 and the driving substrate 25 are arranged at the right and left of the respective substrates at pitch intervals $l_1$ and $l_2$ ($l_1 < l_2$), respectively, similarly to the case in the prior art. Since, as mentioned above, the pitch intervals L1 and L2 at which the electrically members 13 buried in the electrically conducting sheet $l_1$ are arranged correspond to the pitch intervals $l_1$ and $l_2$ at which the respective wiring pads 26 and 27 are arranged, respectively, in place, the number of useless electrically conductive members 13 (ones which do not contact to the wiring pads at all) are minimized. Thus, it is possible to obtain low-cost recording heads using such arrangement.

Further, in the above-mentioned embodiment, the pitch intervals L1 and L2 at which the electrically conductive members are arranged in the insulator 12 may be established correspondingly to the density of current flowing through the respective wiring pads 26 and 27, instead of setting up correspondingly to the pitch intervals $l_1$ and $l_2$ of the respective wiring pads 26 and 27 on the element substrate 24 and the driving substrate 25, respectively. Therefore, in this construction, more electrically conductive members 13 can contact the wiring pads of higher current density, so that it is possible to balance the amount of current through the respective electrically conductive members 13, and make flat the heating amount from and life of the electrically conductive members 13.

Furthermore, the above-mentioned embodiments of this invention is the case where the sizes of the respective wiring pads are all the same, but it is also possible to obtain the similar effects by causing the pitch at which the electrically conductive members are arranged, to be changed, even though the wiring pads is made to vary in size. In this case, it is preferable that the pitch be set to be narrower in the area in which the wiring pads are smaller in size, and set to be wider in the area in which the wiring pads are larger in size.

Figure 9:
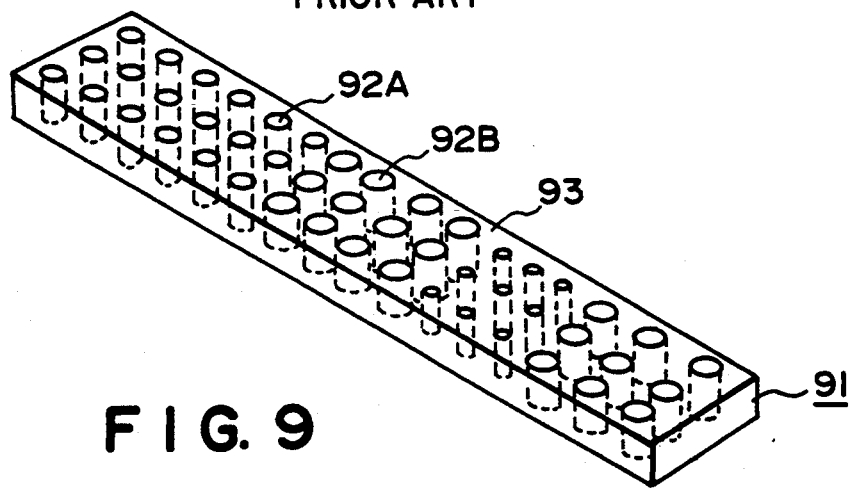
FIG. 9 is a view showing a further embodiment of the electrically conducting sheet for the recording head according to this invention.

FIG. 9 shows an electrically conducting sheet 91 for a recording head having electrically conductive members disposed within an insulator 93 which are caused to vary in size. As is shown in the drawing, the electrically conductive members comprise members 92A which are smaller in size, and members 92B which are larger in size.

The size of the electrically conductive members to be selected may be determined typically depending on the distribution density of the wiring pads on the substrates electrically connected to each other, the amount of current to be passed between the corresponding wiring pads, the size of the wiring pads and the like. Preferably, the higher the distribution density of the wiring pads is or the larger the current flowing between the corresponding wiring pads is, the larger the size of the electrically conductive members is made to be. Incidentally, the electrically conductive members may be varied not only in size but also in pitch at the same time.

With such construction, the increase in production cost resulting from the presence of useless electrically conductive members can be suppressed and the flowing of current through partial electrically conductive members can be prevented, so that the average lives of the electrically conducting sheet for recording heads, the recording head using the same and the recording apparatus can be lengthened. Also, in this invention, since any dispersion of heat from the electrically conductive members can be inhibited, it is possible to carry out a stabilized recording operation.

In the embodiments of this invention, it has been found that as the material of the electrically conductive members 13, and 92A and 92B, gold can be used suitably, but any metal or alloy other than gold can be also used. For example, it may be metal or alloy such as Cu, Al, Sn, Pb—Sn, etc. Further, material comprising a mixture of metal material with one or both of organic and inorganic materials may be used so long as it presents an electrically conductive property. Incidentally, various electrically conductive materials may be used in a single sheet depending on the amount of current through the wiring pads and the pitch of the wiring pads.

In the drawings, the section of the electrically conductive members was shown as a circle, but this invention is not limited thereto. It may be selected from a square or any other shapes.

Also, in the example shown in FIG. 1, the electrically conductive members are not specially limited in thickness. The thickness thereof may be set more than about 20 micro-meters or less than about 20 micro-meters in view of the pitch of the connecting portions on the element substrate 24 and the driving substrate 25, respectively.

Incidentally, the exposed portions of the respective electrically conductive members 13, and 92A and 92B may be coplanar with respect to the surfaces of the insulator 12, 93 or they may be raised from these surfaces. Alternately, these raised portions may be on one or both surfaces of the insulator. Further, the raised portions may be in the form of a bump or a swelling.

The pitch interval at which the electrically conductive members 13, and 92A and 92B are disposed may be the same as that of the respective connecting portions of the element substitute 24 and the driving substitute 25, or may be set narrower than it. In the latter case, it is possible to connect the element substrate 24 and the driving substrate 25 by the electrically conducting sheet without an alignment of the electrically conducting sheet 11, 91 between the element substrate 24 and driving substrate 25 in position.

It is unnecessary for the electrically conductive members 13, and 92A and 92B to be disposed vertically in the insulator 12, 93. They may incline from one of the substrate sides to the other side.

Although in the above description, the electrically conductive member 11, 91 was explained as one having a one layer structure, it may be constructed as a multilayer structure comprising a stack of two or more layers, each of which corresponding to the illustrated electrically conductive member.

There is no special limitation to the material used as the insulator 12, 93 of the electrically conducting sheet 11, 91 in this invention so long as it is has an insulation property. For example, an insulating resin may be used. Further, when a resin is used as the insulator, any kind of resins may be selected. They may be either thermosetting resins or thermoplastic resins. For example, a polyimide resin, a polyphenylene sulfide resin, a polyether sulfone resin, a polyether imide resin, a polysulfone resin, a silicon resin, a fluororesin, a polycarbonate resin, a polybendyn imidazole resin, a phenol resin, a urea resin, a melamine resin, an alkyd resin, an epoxy resin, a polyamide imide resin, a polypropylene resin, a polyvinyl chloride resin, a polystyrene resin or the other resins can be employed. Incidentally, if a resin having good thermal conductivity is selected form the above-indicated resins, more suitable effects can be obtained because, even though a circuit board is heated, such heat can be radiated through the used resin. Further, if a resin having substantially the same coefficient of thermal expansion as that of the material used in the element substrate 24 and the driving substrate 25 is selected, then it is possible to further avoid any reduction of reliability in the apparatus due to thermal expansion and contraction.

Figure 3:
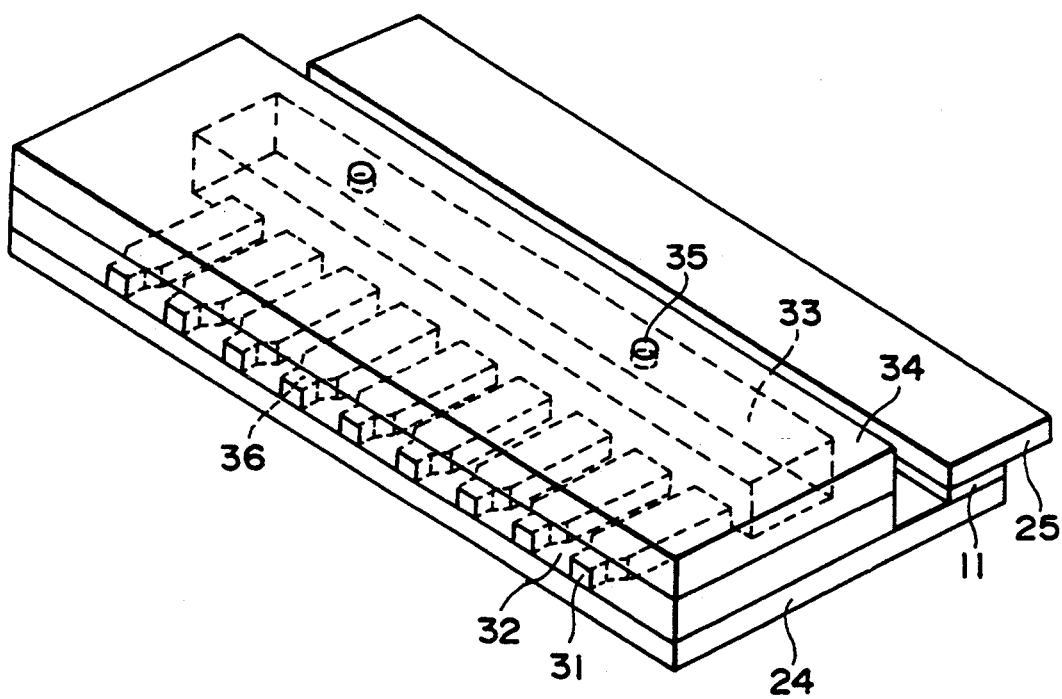
FIG. 3 is a perspective view showing schematically a liquid jet recording head assembly constructed by using the ink jet recording head illustrated in FIG. 2.

FIG. 3 is a perspective view showing schematically a liquid jet recording head assembly constructed by using the ink jet recording head illustrated in FIG. 2. In FIG. 3, reference numeral 31 indicates a discharge port from which recording liquid (ink) droplets are discharged, reference numeral 32 indicates an ink channel wall, reference numeral 33 indicates a common liquid accommodating chamber, reference numeral 34 indicates a top wall for the common liquid accommodating chamber, reference numeral 35 indicates an ink supplying hole provided on the top wall and from which the recording liquid is supplied into the common liquid accommodating chamber 33. These components are installed on the element substrate 24. A driving signal fed from the driving substrate 25 connected through the electrically conducting sheet 11 to the element substrate 24 energizes an energy generating element disposed in each of the ink channel 36 to discharge recording liquid.

Figure 4:
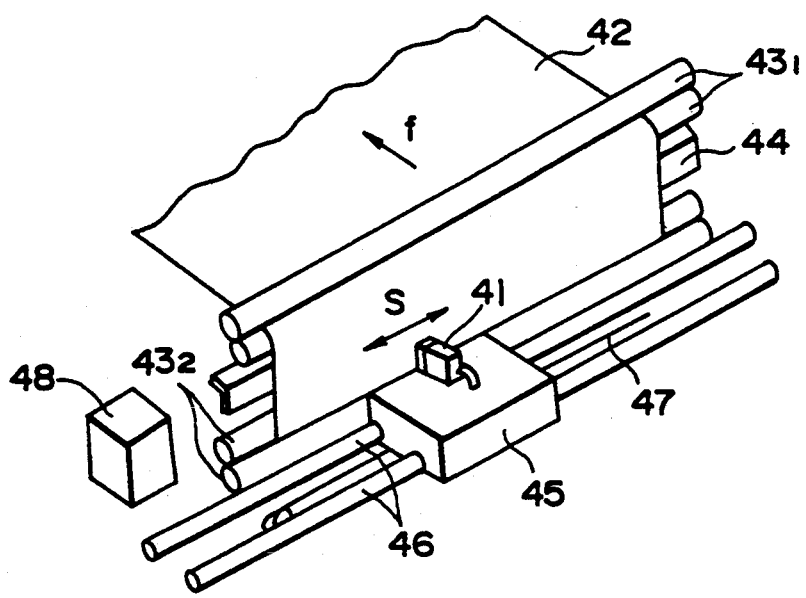
FIG. 4 and FIG. 5 are perspective views each showing the main part of a different ink jet recording apparatus using the liquid jet recording head assembly illustrated in FIG. 3.

FIG. 4 is a perspective view showing the main part of an ink jet recording apparatus using the liquid jet recording head assembly illustrated in FIG. 3. A liquid jet recording head assembly 41 is mounted on a carriage 45 which moves in the directions indicated an arrow S in the drawing along guiding shafts 46. The movement of the carriage 45 in the directions shown by the arrow S is carried out with the use of a belt transmission mechanism 47. A recording paper 42 which acts as a recording medium is advanced in a direction shown by f in the drawing by two form feeding roller pairs 43-1 and 43-2 included in form conveying means for the recording medium in such a condition that it is controlled to be flat. The recording process for the recording medium 42 is made on a platen 44. An ink restoration mechanism 48 is provided at the left side of the platen 44, which wipes the tips of the liquid jet recording head 41 at the time of the start of operation of the apparatus.

Accordingly, in the embodiment shown in FIG. 4, the recording is made on the recording paper 42 conveyed in the direction f in the drawing by the liquid jet recording head assembly 41 advanced in the directions S in the drawing.

Figure 5:
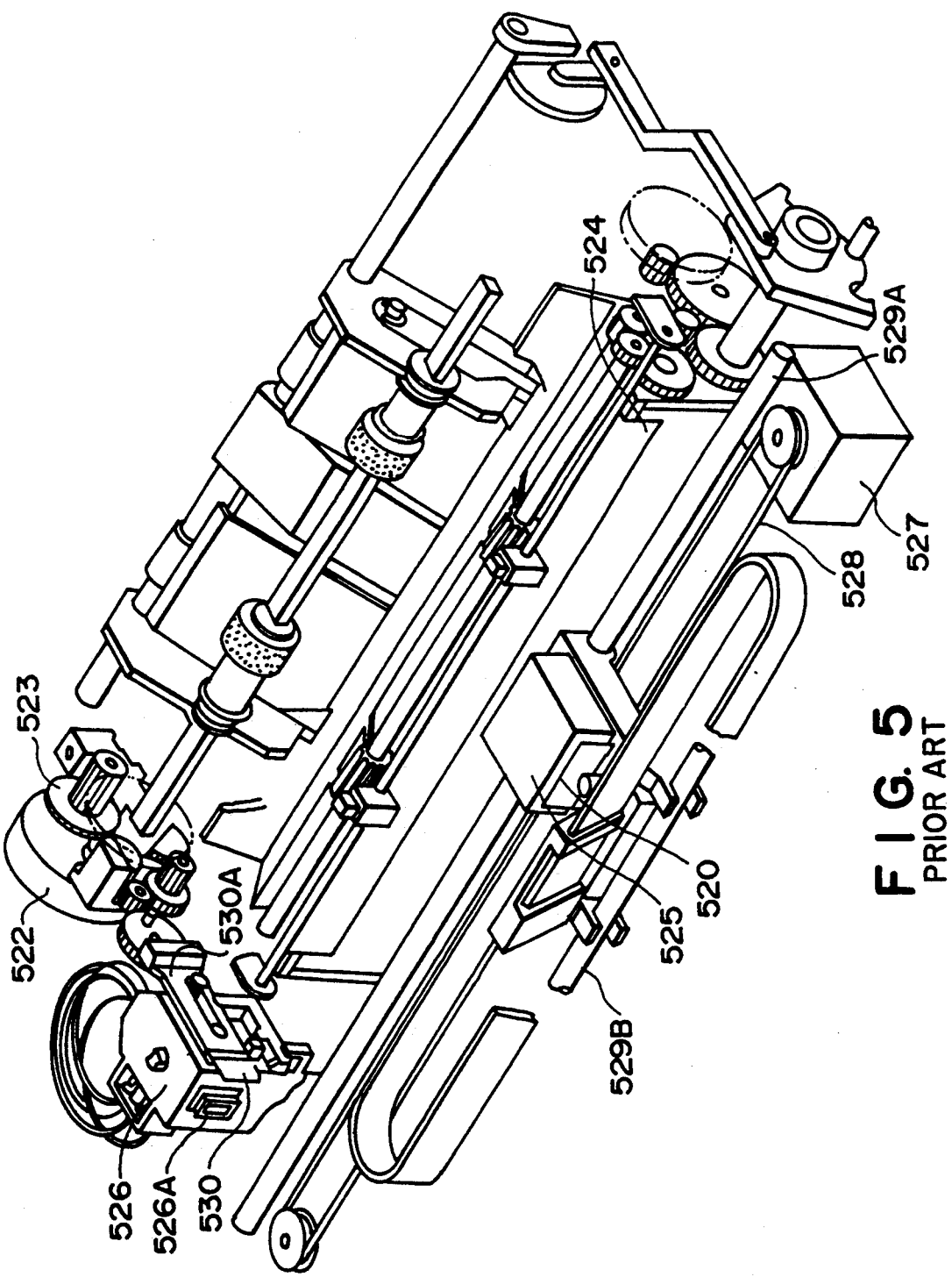

FIG. 5 is a perspective view showing an alternative example to the ink jet recording apparatus using the liquid jet recording head assembly shown in FIG. 3. In FIG. 5, reference numeral 520 identifies an ink jet cartridge (IJC) having a group of nozzles for discharging ink, which are confronted to the recorded face of the recording paper which is advanced over a platen 524. Reference numeral 525 indicates a carriage (HC) which holds the IJC 520. The carriage 525 is coupled to a portion of a driving belt 528 which transmits thereto the drive power of a driving motor 527 and is slidable along two guide shafts 529A and 529B which are arranged in parallel with each other, so that it can reciprocate across the whole width of the recording paper.

Reference numeral 526 indicates a head restoration device positioned at one end of the moving path of the IJC 520, for example a position facing to the home position of the IJC. The head restoration device caps the head 520 by using the driving power of a motor 522 through a transmission mechanism. In connection with the capping operation of the capping portion 526A of the head restoration device 526 to the IJC 520, ink suction by appropriate suction means provided within the head restoration device and ink compression by appropriate pressurizing means provided in the ink feeding path to the IJC 520 are made to exhaust forcedly ink from the discharge ports, so that a discharge recovery process, for example of removing ink of which viscosity increased within the nozzle, is performed Also, the recording head can be protected with the capping at the time of, for example, the termination of the recording.

Reference numeral 530 is a blade which acts as the wiping member. It is formed of silicone rubber and positioned at the side of the head recovery device 526. The blade 530 is supported in a cantilever fashion by a blade holding member 530A and driven by the motor 522 and the transmission mechanism 523 in the same way as in the case of the head recovery device, so that it can engage with the discharge face of the IJC 520. With this construction, the blade 530 is projected into the moving path of the IJC 520 at a appropriate timing in the recording operation of the IJC 520 or after the discharge recovery process by the head restoration device 526 so as thereby to wipe or remove bedewing, wetting, fouling, contaminant on the discharge face of the IJC 520, accompanied with the movement of the IJC 520.

It has been found that this invention brings advantageous effects when it is used specially with a recording head and recording apparatus in an ink jet recording system having means for generating a heat energy which is used to effect ink discharge, said heat energy causing the ink to change to flying liquid droplets.

In order to realize this, it is preferable to use the basic principle and typical construction disclosed in U.S. Pat. Nos. 4,723,129 and 4,740,796, for example. This disclosed system is applicable to both of so called a on-demand type and a continuous type. Specifically, application to the on-demand type is desirable because, by applying, to electrothermal converters arranged in relation to a sheet or liquid channels holding therein recording liquid (ink), at least one driving signal corresponding to record information and giving the ink rapid temperature rise beyond nucleate boiling, to cause the electrothermal converters to generate heat energy and cause recording liquid adjacent to the heat active surface of the recording head to film boil, a bubble can be produced in the recording liquid (ink) with the 1-to-1 correspondence to such driving signal. Recording liquid (ink) is discharged in the air through a discharge port by an active force occurred in the course of growth and contraction of this bubble, and resulting at least one droplet are formed. If a driving signal comprising a pulse waveform is used, the growth and contraction of the bubbles are performed immediately and fittingly. Thus, this is suitable since a liquid (ink) discharging arrangement which is specially superior in responsiveness is obtainable. As this pulse type driving signal, those which are disclosed in U.S. Pat. Nos. 4,463,359 and 4,345,263 are suited. Incidentally, it is possible to perform more suitable recording if the conditions which is described in U.S. Pat. No. 4,313,124 disclosing an invention relating to the temperature raise rate of said heat active surface are employed.

A combination structure of discharge ports, liquid channels and electrothermal converters (linear liquid channels and right-angled liquid channels) as disclosed in the specifications of the above-mentioned patents, as well as a structure wherein a heat active portion is placed in a curved area, as shown in U.S. Pat. Nos. 4,558,333 and 4,459,600 is also useable in this invention as the recording head within the scope thereof.

Further, this invention can exhibit the above-mentioned advantages more effectively, when used with a full-line type recording head having its length corresponding to the maximum recording width within which the recording apparatus can produce recording on the recording medium across a line, which full-line head may be constructed by the combination of a plurality of the recording heads filling the length of a full-line as is shown in the above-mentioned U.S. patent specification or by a unitary recording head formed in unit across said one full recording line.

In addition, this invention is effective when using a replaceable chip-type recording head which can receive an electric power and ink from the apparatus main body when attached thereto, or a cartridge type recording head accommodating therein various related units including an ink holding tank.

Also, in order to more stabilize the advantages of this invention, additional means may be preferably provided in this invention including recovering means and preparatory supporting means for the recording head. In detail, such additional means for the recording head may include capping means, cleaning means, pressurizing and absorbing means, preparatory heating means comprising electrothermal converters and/or the other heating elements, preparatory discharge mode establishing means which permits preparatory discharging other than in recording, and the other means for causing the recording head to perform the stable operation.

Further, this invention is effectively applicable to the various recording modes in the recording apparatus including a monochromatic recording mode in which black or another mainstream color is used, a multi-color recording mode utilizing different colors and a full color recording mode utilizing color mixture. In these color recording modes, the unitary head type or multihead combination type can be used as the recording head.

Further, in addition to the above, the, recording apparatus having the recording mechanism using the liquid jet recording head assembly according to this invention can take various forms including an image output terminal for information processing apparatus such as computers, a duplicating apparatus combined with a reader unit, etc., and a facsimile machine having transmitting and receiving capabilities.

Figure 10:
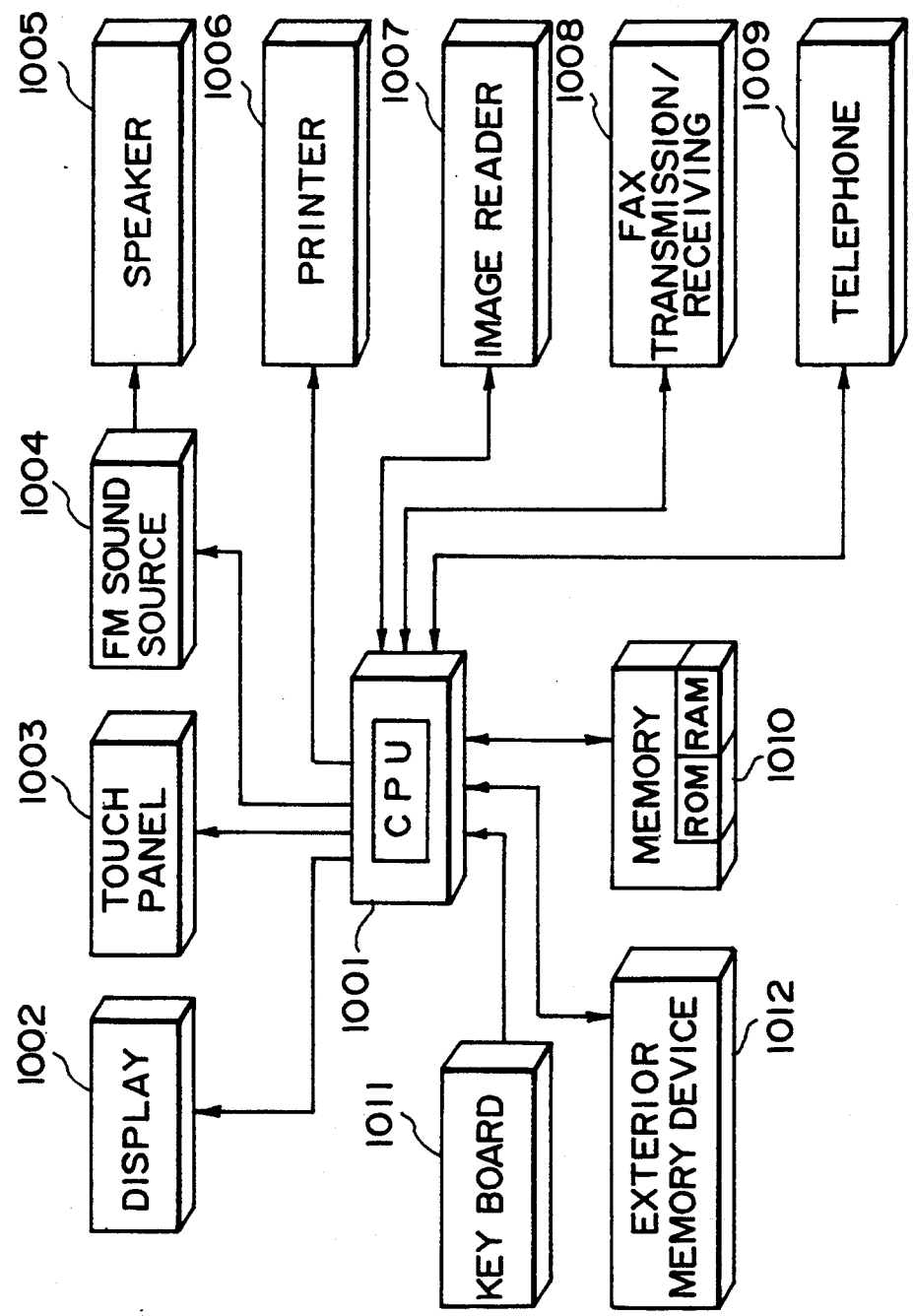
FIG. 10 is a view showing the outline of an information processing system to which the recording apparatus of this invention is applicable.

FIG. 10 is a block diagram showing schematically an arrangement wherein the recording apparatus according to this invention is applied to an information processing system having functions as a word processor, a personal computer, a facsimile machine and a copying machine.

In FIG. 10, reference numeral 1001 identifies the control part for controlling the whole system, which is provided with a CPU comprising a micro-processor, etc., and various I/O ports through which it outputs therefrom control signals and data to each part and inputs thereto the control signals and data from each part. Reference numeral 1002 indicates a display part which displays thereon various menus, document information, image data picked out by an image reader 1007, etc. Reference numeral 1003 identifies a touch panel of a transparent pressure sensing type, provided on the display 1002, which permits entry inputs and coordinate data inputs, etc. from the display screen by pushing the screen face with a finger, etc.

Reference numeral 1004 identifies an FM (Frequency Modulation) sound source which frequency modulates music information produced by a music editor and read out from a memory 1010 or an exterior memory device 1812 which has stored the music information as digital data. The electric signal from the FM sound source 1004 is supplied to a loud speaker 1005 to be converted to an audible sound. Reference numeral 1006 is a printer part to which the recording apparatus according to this invention is applied as an output terminal which may be an word processor, a personal computer, a facsimile machine or a copying machine.

Reference numeral 1007 identifies an image reader part which inputs manuscript data photoelectrically read thereby. The image reader is positioned in the path conveying the manuscript to read various manuscripts including a facsimile manuscript and copied manuscript. Reference numeral 1008 is a facsimile (FAX) transmission/receiving part having an interface to the exterior, which facsimile-transmits the manuscript date read by the image reader 1007 and receives and decodes incoming facsimile data. Reference numeral 1009 is a telephone set having a usual telephone function and various telephone function including a recorder phone function.

The memory 1010 includes a ROM which stores system programs, manager programs, application programs, character fonts, dictionaries and the like, a RAM which temporarily stores application programs, document information, et al. loaded from the exterior memory device 1012, and a video RAM.

Reference numeral 1011 indicates a keyboard by which document information, various commands or the like is input.

The exterior memory device 1012 has a floppy disc drive or a hard disc drive, for example as a recording medium, which stores document information, music or voice information, user application or the like.

Figure 11:
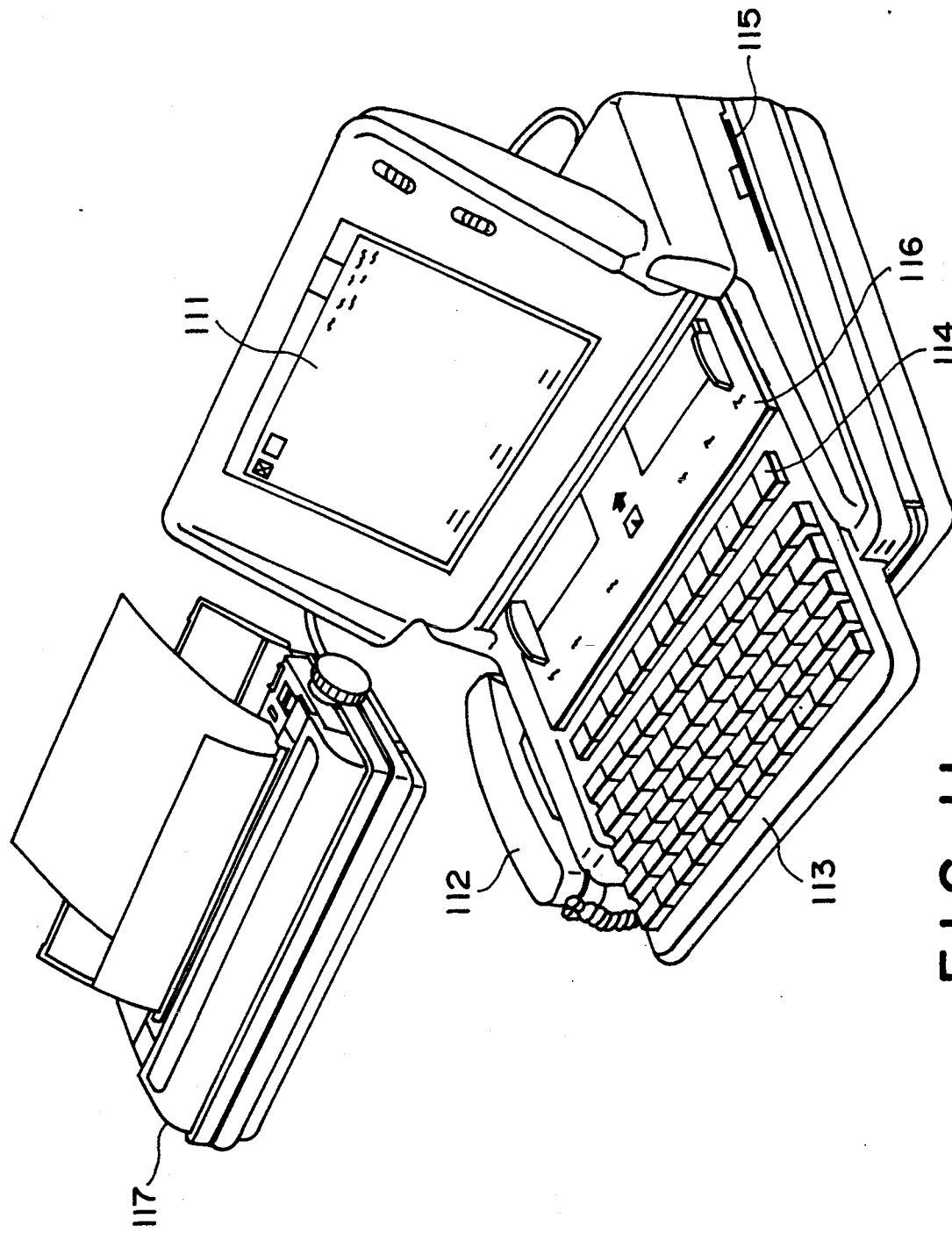
FIG. 11 is an outline view showing schematically the information processing system illustrated in FIG. 10.

FIG. 11 is an outline view showing schematically the information processing system illustrated in FIG. 10. In the figure, reference numeral 111 identifies a fiat panel display using liquid crystal, et al., which displays various menu, graphic information, document information, et al. On this display, the touch panel 1003 is attached, which permits entry inputs and coordinate data inputs, etc. by pushing its surface with a finger, etc. Reference numeral 112 is an handset which is used when the apparatus functions as the telephone. A keyboard 113 is connected through a cord so that it is electrically and attachably coupled to the machine to permit various document information inputs and various data inputs. The keyboard 113 is provided with various function keys 117. Reference numeral 115 is an insertion port through which a floppy disc is fed into the exterior memory device 1012.

Reference numeral 117 identifies a form positioning part on which the manuscript to be read by the image reader 1007 is positioned. The manuscript which has been read by image reader is exhausted from the backside of the machine. When the machine is in the facsimile receiving operation mode, for example an ink jet printer becomes active.

Incidentally, although the display part 1002 can employ a CRT display, it is preferable to use the above-mentioned flat panel comprising a liquid crystal display, making use of ferroelectric liquid crystal in the light of the fact that it makes the machine small, thin, slim and light.

In the case where the machine works as the personal computer or the word processor, various information input from the keyboard 211 is processed in the control part 1001 according to a predetermined program, and output to the printer part 1006 as an image.

If the machine functions as the receiver for the facsimile, then facsimile information input from the FAX transmission/receiving part 1008 through telechannel lines are processed in the control part 1001 according to a predetermined program, and output to the printer part 1006 as a received image.

Further, when the machine functions as the copying machine, the manuscript is read by the image reader part 1007, and the manuscript data from the image reader is output to the printer part 1006 through the control part 1001 as a copy image. Incidentally, in the case where the machine is in the mode of the facsimile transmitter, the manuscript data obtained bit the image reader 1007 which reads a manuscript is processed for the transmission thereof in the control part 1001 according to a predetermined program, and then, sent to the telechannel lines through the FAX transmission/receiving part 1008.

Figure 12:
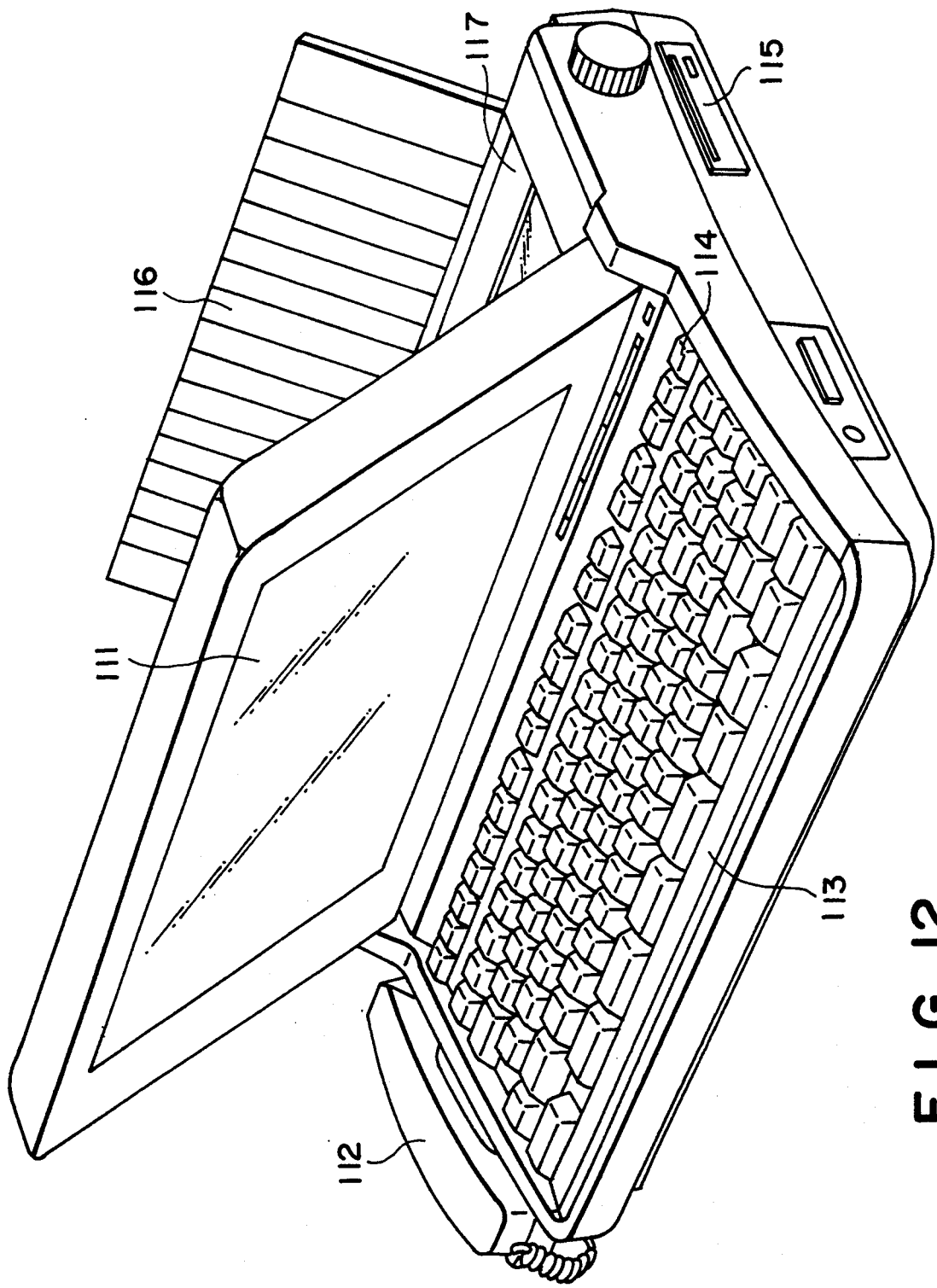
FIG. 12 is an outline view showing schematically another information processing system.

Incidentally, the above-mentioned information processing machine may be constructed of an integral type with the ink jet printer accommodated therein to improve its portability, as is shown in FIG. 12. In the figure, corresponding reference numerals are given to the parts having the same functions as those shown in FIG. 11.

As described above, since with the above-mentioned multifunction information processing system to which the recording apparatus according to this invention has been applied, it is possible to obtain a high quality recording image at a high speed and a low noise, the function of the above information processing system can be further increased.

This invention as constructed above has following advantages:

In accordance with this invention, it is unnecessary to dispose the electrically conductive members at a high density over the whole of the electrically conducting sheet, by causing the electrically conductive members to vary in place or in distribution density. Accordingly, it is possible to improve the yield of the production thereof and decrease the production cost thereof.

Further, in accordance with this invention, the rate of the presence of the electrically conductive members which do not contact with the wiring pads at all is decreased by causing the electrically conductive members to vary in size or in distribution density correspondingly to the distribution density of the respective wiring pads of the substrates. This contributes to high efficiency in addition to the above-mentioned advantage.

Further, in accordance with this invention, the electrically conductive members are balanced in life and in the rate of fatigue by causing the electrically conductive members to vary in size and in distribution density correspondingly to the amount of current flowing through the respective wiring pads of the substrates. This provide the electrically conducting sheet of which life is elongated, in addition to the above-mentioned advantages.

Furthermore, in accordance with this invention, it can provide recording apparatus of various types of which production cost is cheap and of which life is elongated.

What is claimed is:

1. A recording head comprising:
a first substrate having a plurality of wiring pads in which electrical currents in respective said wiring pads have different densities;
a second substrate having a plurality of wiring pads for electrical connection to said wiring pads of said first substrate; and
an electrically conducting sheet having faces contacting said first and said second substrates and having a plurality of electrically conductive members disposed in an insulator, wherein a plurality of said electrically conductive members electrically connect each said wiring pad on said first and said second substrates, wherein a distribution density of said electrically conductive members of said electrically conductive sheet is high at a portion connected to those of said wiring pads where an electrical current of high density flows and is low at a portion connected to those of said wiring pads where an electrical current of low density flows among said wiring pads of said first and said second substrates.

2. A recording head according to claim 1, wherein the recording head is a full line type having discharge ports arranged across the whole width of the recording area on a recording medium.

3. A recording head according to claim 1, wherein the recording head is a type discharging ink by using heat energy, and said first substrate includes electrothermal energy converters for inducing ink discharge by generating heat energy to produce film boiling in the ink.

4. A recording head according to claim 1 or 2, wherein said first substrate is an element substrate having mounted thereon energy generators for inducing ink discharge, and said second substrate is a driving substrate for supplying driving signals to said energy generators.

5. A recording head comprising:
a first substrate having a plurality of wiring pads in which electrical currents in respective said wiring pads have different densities;
a second substrate having a plurality of wiring pads for electrical connection to said wiring pads of said first substrate; and
an electrically conducting sheet having faces contacting said first and said second substrates and having a plurality of electrically conductive members disposed in an insulator wherein a plurality of said electrically conductive members electrically connect corresponding said wiring pads on said first and second substrate, wherein a size of said electrically conductive members of said electrically conductive sheet is large at a portion connected to those of said wiring pads where an electrical current of high density flows and is small at a portion connected to those of said wiring pads where an electrical current of low density flows among said wiring pads of said first and said second substrates.

6. A recording head according to claim 5, wherein the recording head is a full line type having discharge ports arranged across the whole width of the recording area on a recording medium.

7. A recording head according to claim 5, wherein the recording head is a type discharging ink by using heat energy, and said first substrate includes electrothermal energy converters for inducing ink discharge by generating heat energy to produce film boiling in the ink.

8. A recording head according claim 5, wherein said first substrate is an element substrate having mounted thereon energy generators for inducing ink discharge, and said second substrate is a driving substrate for supplying driving signals to said energy generators.

9. A recording apparatus comprising:

a recording head for discharging an ink onto a recording medium, the recording head including a first substrate having a plurality of wiring pads in which electrical currents in respective said wiring pads have different densities, a second substrate having a plurality of wiring pads for electrical connection to said wiring pads of said first substrate, and an electrically conducting sheet having faces contacting said first and said second substrates and having a plurality of electrically conductive members disposed in an insulator, wherein a plurality of said electrically conductive members electrically connect each said wiring pad on said first and said second substrates, wherein a distribution density of said electrically conductive members of said electrically conductive sheet is high at a portion connected to those of said wiring pads where an electrical current of high density flows and is low at a portion connected to those of said wiring pads where an electrical current of low density flows among said wiring pads of said first and said second substrates; and means for conveying the recording medium and said recording head relative to each other.

10. A recording apparatus according to claim 9, wherein the recording head is a full line type having discharge ports arranged across the whole width of the recording area on the recording medium.

11. A recording apparatus according to claim 9, wherein the recording head is a type discharging ink by using heat energy, and said first substrate includes electrothermal energy convertors for inducing ink discharge by generating heat energy to produce film boiling in the ink.

12. A recording apparatus according to claim 9 or 10, wherein said first substrate is an element substrate having mounted thereon energy generators for inducing ink discharge, and said second substrate is a driving substrate for supplying a driving signals to said energy generators.

13. A recording apparatus comprising:

a recording head for discharging an ink onto a recording medium, the recording head including a first substrate having a plurality of wiring pads in which electrical currents in respective said wiring pads have different densities, a second substrate having a plurality of wiring pads for electrical connection to said wiring pads of said first substrate, and an electrically conducting sheet having faces contacting said first and said second substrates and having a plurality of electrically conductive members disposed in an insulator, wherein a plurality of said electrically conductive members electrically connect each said wiring pad on said first and said second substrates, wherein a size of said electrically conductive members of said electrically conductive sheet is large at a portion connected to those of said wiring pads where an electrical current of high density flows and is small at a portion connected to those of said wiring pads where an electrical current of low density flows among said wiring pads of said first and said second substrates; and means for conveying the recording medium and said recording head relative to each other.

14. A recording apparatus according to claim 13, wherein the recording head is a full line type having discharge ports arranged across the whole width of the recording area on a recording medium.

15. A recording apparatus according to claim 13, wherein the recording head is a type discharging ink by using heat energy, and said first substrate includes electrothermal energy converters for inducing ink discharge by generating heat energy to produce film boiling in the ink.

16. A recording apparatus according to claim 13 or 14, wherein said first substrate is an element substrate having mounted thereon energy generators for inducing ink discharge, and said second substrate is a driving substrate for supplying a driving signals to said energy generators.

* * * * *

UNITED STATES PATENT AND TRADEMARK OFFICE
CERTIFICATE OF CORRECTION

PATENT NO. : 5,420,620
DATED : May 30, 1995
INVENTOR(S) : HIDEO TAMURA

It is certified that error appears in the above-identified patent and that said Letters Patent is hereby corrected as shown below:

ON TITLE PAGE

In [56] References Cited, under FOREIGN PATENT DOCUMENTS: "1302830" should read --1-302830--.

In [57] ABSTRACT, Line 2, "a" should read --an--.

COLUMN 1

Line 22, "substrate, to the first substrate" should read --substrate.--.
Line 23, "being" should be deleted.

COLUMN 2

Line 7, "to" should be deleted.
Line 13, "specially," should read --especially,--.
Line 53, "that" should read --and that--.

COLUMN 3

Line 51, "pad" should read --pads--.

COLUMN 4

Line 27, "specially" should read --especially-- and "a" should read --an--.
Line 65, "specially" should read --especially--.

UNITED STATES PATENT AND TRADEMARK OFFICE
CERTIFICATE OF CORRECTION

PATENT NO. : 5,420,620
DATED : May 30, 1995
INVENTOR(S) : HIDEO TAMURA

It is certified that error appears in the above-identified patent and that said Letters Patent is hereby corrected as shown below:

COLUMN 5

Line 21, "members 13" should read --conductive members 13--.
Line 22, "sheet $l_1$" should read --sheet 11--.
Line 44, "embodiments" should read --embodiment--.
Line 49, "is" should read --are--.

COLUMN 6

Line 50, "substitute 24" should read --substrate 24-- and "substitute 25," should read --substrate 25,--.

COLUMN 7

Line 1, "is" should be deleted.

COLUMN 8

Line 21, "means-provided" should read --means provided--.
Line 26, "formed" should read --formed.--.
Line 38, "a" should read --an--.
Line 46, "specially" should read --especially--.
Line 54, "of so called a" should read --a so-called--.
Line 68, "occurred" should read --occurring--.

COLUMN 9

Line 6, "specially" should read --especially--.
Line 11, "is" should read --are--.
Line 46, ".heating" should read --heating--.
Line 61, "the," should read --the--.

UNITED STATES PATENT AND TRADEMARK OFFICE
CERTIFICATE OF CORRECTION

PATENT NO. : 5,420,620

DATED : May 30, 1995

INVENTOR(S) : HIDEO TAMURA

It is certified that error appears in the above-identified patent and that said Letters Patent is hereby corrected as shown below:

COLUMN 10

```
Line 25, "1812" should read --1012--.
Line 31, "an" should read --a--.
Line 40, "date" should read --data--.
Line 66, "an" should read --a--.
```

COLUMN 11

```
Line 12, "example" should read --example,--.
Line 37, "bit" should read --by--.
```

COLUMN 12

```
Line 13, "vide" should read --vides--.
```

COLUMN 13

```
Line 4, "substrate," should read --substrates,--.
Line 20, "converters" should read --convertors--.
```

UNITED STATES PATENT AND TRADEMARK OFFICE
CERTIFICATE OF CORRECTION

PATENT NO. : 5,420,620
DATED : May 30, 1995
INVENTOR(S) : HIDEO TAMURA

Page 4 of 4

It is certified that error appears in the above-identified patent and that said Letters Patent is hereby corrected as shown below:

COLUMN 14

Line 13, "a" should be deleted.
Line 48, "converters" should read --convertors--.
Line 54, "a" should be deleted.

Signed and Sealed this

Twenty-first Day of November, 1995

Attest:

BRUCE LEHMAN

Attesting Officer

Commissioner of Patents and Trademarks